US006913961B2

(12) United States Patent
Hwang

(10) Patent No.: US 6,913,961 B2
(45) Date of Patent: Jul. 5, 2005

(54) METHOD OF MANUFACTURING HIGH-K GATE DIELECTRIC BY USE OF ANNEALING IN HIGH-PRESSURE HYDROGEN ATMOSPHERE

(75) Inventor: Hyun Sang Hwang, Kwangju (KR)

(73) Assignee: Kwangju Institute of Science and Technology, Kwangju (KR)

(*) Notice: Subject to any disclaimer, the term of this patent is extended or adjusted under 35 U.S.C. 154(b) by 0 days.

(21) Appl. No.: 10/850,473

(22) Filed: May 19, 2004

(65) Prior Publication Data

US 2004/0266117 A1 Dec. 30, 2004

(30) Foreign Application Priority Data

Jun. 30, 2003 (KR) .............................. 10-2003-0043709

(51) Int. Cl.[7] ......................................... H01L 21/8238
(52) U.S. Cl. ..................... 438/216; 438/287; 438/591
(58) Field of Search .............................. 438/216, 287, 438/591, FOR 202; 257/E29.132, E21.194, E21.639

(56) References Cited

U.S. PATENT DOCUMENTS

| | | | | |
|---|---|---|---|---|
| 3,766,637 | A | * 10/1973 | Norris et al. | ............... 438/216 |
| 6,387,761 | B1 | 5/2002 | Shih et al. | |
| 6,544,906 | B2 | * 4/2003 | Rotondaro et al. | ......... 438/785 |
| 2002/0081826 | A1 | * 6/2002 | Rotondaro et al. | ......... 438/585 |
| 2004/0038488 | A1 | * 2/2004 | Mouli | ....................... 438/292 |

OTHER PUBLICATIONS

Onishi, Katsunori et al., "Improvement of Surface Carrier Mobility of HfO2 MOSFETs by High–Temperature Forming Gas Annealing", Feb. 2003, IEEE Transactions on Electron Devices, vol. 50, No. 2, p. 384–390.*

Lee, Jack C., "Hf–based High–K Dielectrics", The University of Texas at Austin, Austin TX, IWGI 2003, Tokyo, p. 4–9.*

Onishi, Katsunori et al., "Bias–Temperature Instabilities of Polysilicon Gate HfO2 MOSFETs", Jun. 2003, IEEE Transactions of Electron Devices, vol. 50, No. 6, p. 1517–1524.*

Rino Choi et al., "Fabrication of High Quality Ultra–thin $HfO_2$ Gate Dielectric MOSFETs Using Deuterium Anneal," International Electron Devices Meeting (IEDM), pp. 613–616, Dec. 2002.

* cited by examiner

Primary Examiner—George Fourson
Assistant Examiner—Michelle Estrada
(74) Attorney, Agent, or Firm—Martine Penilla & Gencarella, LLP

(57) ABSTRACT

Disclosed is a method of manufacturing a high-k gate dielectric, characterized in that an annealing process in a forming gas atmosphere, corresponding to a final step of a manufacturing process of a semiconductor device based on MOSFET fabrication techniques, is applied for a high-k gate dielectric-containing semiconductor device, under high pressure, instead of conventional atmospheric pressure, whereby passivation effects of interface charges and fixed charges of the semiconductor device can be maximized even at relatively low temperatures.

1 Claim, 3 Drawing Sheets

METHOD OF MANUFACTURING HIGH-K GATE DIELECTRIC BY USE OF ANNEALING IN HIGH-PRESSURE HYDROGEN ATMOSPHERE

BACKGROUND OF THE INVENTION

1. Field of the Invention

The present invention relates to a method of manufacturing a high-k gate dielectric, characterized in that an annealing process in a forming gas atmosphere, corresponding to a final step of a manufacturing process of a semiconductor device based on fabrication techniques of MOSFET (Metal-Oxide-Silicon Field Effect Transistor), is applied for a semiconductor device having a high-k gate dielectric, under conditions of high concentration (100%) and high pressure, instead of conventional conditions of low concentration (3–5%) and atmospheric pressure, whereby interface charges and fixed charges of the semiconductor device can be maximally passivated even at relatively low temperatures.

2. Description of the Related Art

In general, a manufacturing method of a semiconductor device, which uses silica ($SiO_2$) as a gate dielectric, includes metallization, followed by annealing at about 400450° C. for 10–30 min in a forming gas atmosphere containing about 3–4% hydrogen. In such cases, the annealing treatment functions to allow interface charges existing on an interface of the gate dielectric to be passivated by hydrogen. Thereby, the interface state density is decreased to about $10^{11}/cm^2\text{-eV}$ or less, thus ensuring superior charge mobility of the device.

On the other hand, a high-k gate dielectric has much higher interface charges and fixed charges (about 10–1000 times or more) before the annealing treatment, compared to those of silica. Thus, there is required an annealing treatment in a hydrogen atmosphere of relatively high concentrations and high temperatures. In this regard, Jack Lee, Professor, University of Texas, Austin, USA, published a paper (p. 613) on IEDM in December 2002, the paper concerning a method of improving interface charge properties of a high-k gate dielectric composed of forming a high-k gate dielectric, which is then annealed at high temperatures of about 600–700° C. in about 4% hydrogen/deuterium atmosphere, followed by metallization.

At this time, the reason why the high-temperature annealing is performed before the metallization is that the process temperature cannot be increased to 450° C. or more after the metallization, due to the relatively low melting point of aluminum. Further, since 5% or more hydrogen is explosive, the use of hydrogen with a low concentration of 4% or less is preferable for annealing under atmospheric pressure.

However, the above mentioned method has the following drawbacks.

First, although the high-temperature annealing process using forming gas, which is applied for the high-k gate dielectric before the metallization, can passivate interface/fixed charges, it leads to increased effective thickness of the dielectric, and deteriorated leakage current properties due to crystallization. Hence, this process should be performed at relatively low temperatures.

Second, even though passivation is achieved before the metallization, the metallization may cause plasma damage, thereby increasing interface charges over again. Accordingly, it is more preferable that the interface of the high-k gate dielectric is subjected to passivation at low temperatures after the metallization.

SUMMARY OF THE INVENTION

Therefore, it is an object of the present invention to alleviate the problems in the related art and to provide a method of effectively passivating charges caused by metallization, by using a low hydrogen concentration and high temperature process after the metallization.

To achieve the above object, the present invention provides a method of manufacturing a high-k gate dielectric, comprising annealing a semiconductor device in a high-pressure gas atmosphere, thus increasing the electrical properties of the gate dielectric.

In such cases, the annealing of the semiconductor device is preferably performed at 250–450° C. under 3–100 atm in a 100% hydrogen or 100% deuterium atmosphere.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of a method of manufacturing a high-k gate dielectric by use of an annealing process in a high-pressure hydrogen atmosphere of the present invention, with reference to the appended drawings.

Figure 1A:
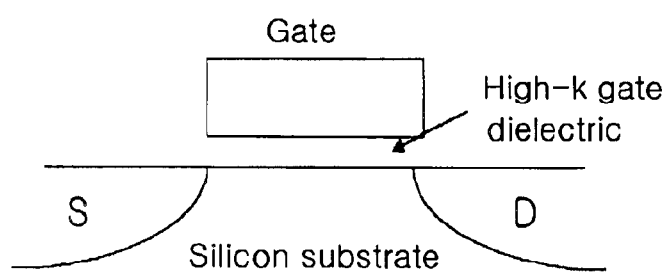
FIG. 1a is a sectional view showing a high-k gate dielectric obtained by deposition using a forming gas, according to the present invention.
Figure 1B:
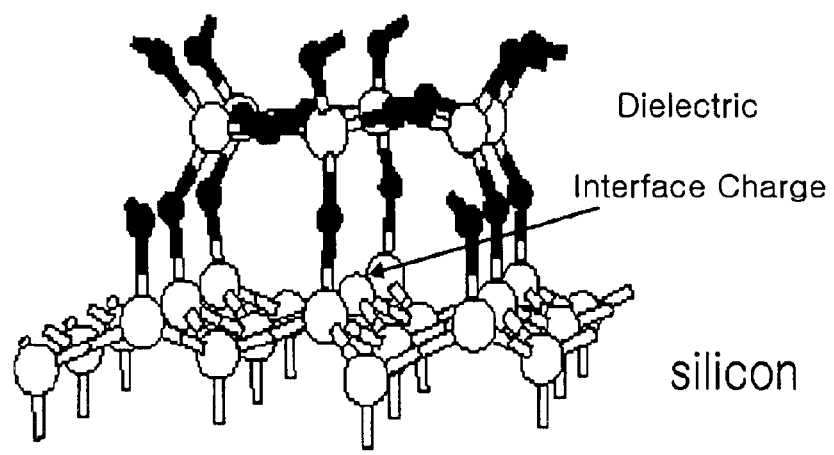
FIG. 1b is a sectional view showing an atom structure of an interface, according to the present invention.

FIG. 1a is a sectional view of a high-k gate dielectric deposited by use of a forming gas, according to the present invention, and FIG. 1b is a sectional view of an atom structure of an interface of the gate dielectric.

Referring to FIGS. 1a and 1b, there exist about $5\times10^{14}/cm^2$ silicon atoms on a Si surface, which are, for the most part, combined with oxygen by a $SiO_2$ forming process. However, among these atoms, about 1–0.1% of atoms are used to form dangling bonds. To decrease the formation of the dangling bonds, when Si is subjected to annealing in a hydrogen atmosphere, most of the bonds become passivated. Eventually, only the bonds of about 0.01% or less (about $5\times10^{10}/cm^2$ or less) remain, which are formed into an interface charge.

SiO$_2$ results from oxidation of the silicon substrate by a thermal oxidation process, and hence, has very low interface charges. Meanwhile, the high-k gate dielectric formed by a deposition process has essentially many dangling bonds. That is, even after a conventional annealing process in a forming gas atmosphere (450° C./4–5%) is performed, about 1% of bonds remain as the dangling bonds, which negatively affect electrical properties of manufactured devices.

In the present invention, to effectively passivate the interface/fixed charges of the high-k gate dielectric after metallization, there are provided the conditions of hydrogen and deuterium atmosphere of high concentration (100%) and high pressure (>3 atm) at relatively low temperatures of 450° C. or less. Further, while larger quantities of hydrogen or deuterium are supplied on the gate dielectric at low temperatures, the interface charges and the fixed charges are passivated, hence increasing the device properties. In particular, by using deuterium rather than hydrogen, the reliability of the device is improved under electrical stress on account of heavy mass effects of deuterium.

With the aim of accomplishing better experimental properties in consideration of low melting point of aluminum, the temperature is set to 450° C. or less and the pressure of 3 atm or more is applied.

Figure 2:
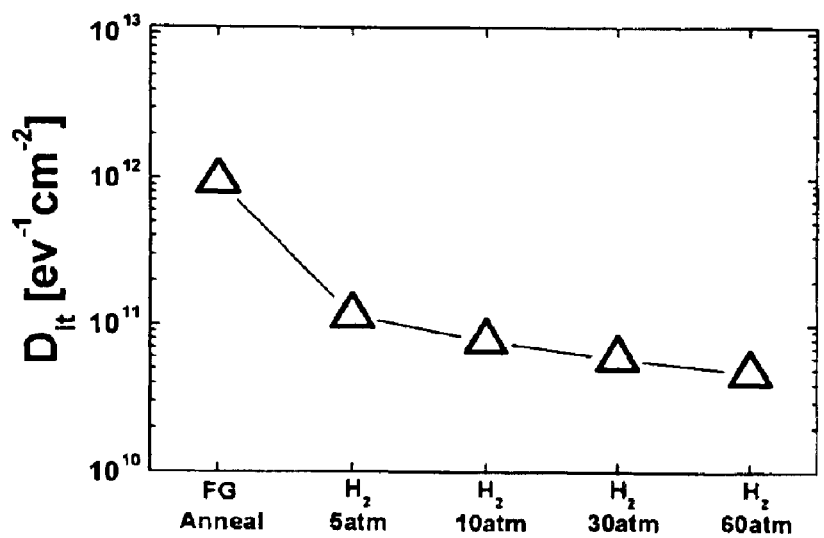
FIG. 2 is a graph showing interface state density properties of two types of samples, one type of which is conventionally annealed using a forming gas, the other type of which is annealed under high-pressure hydrogen in various conditions, according to the present invention.

FIG. 2 shows interface state density properties of a sample annealed conventionally by use of a forming gas and samples annealed under high-pressure hydrogen of various conditions, according to the present invention. As such, HfO$_2$ is used as a gate dielectric.

As shown in FIG. 2, the interface state density of the sample, which is annealed under high-pressure hydrogen according to the present invention, is drastically decreased. This is because high interface charges of the gate dielectric are reduced by the high-pressure hydrogen annealing process.

As mentioned in FIG. 1, since many atomic bonds exist in the gate dielectric and the interface of dielectric/substrate, the interface state density increases. If the hydrogen-annealing treatment is performed under proper conditions, such atomic bonds in the gate dielectric and the interface of dielectric/substrate are combined with hydrogen, and thus, become electrically passivated.

SiO$_2$ having generally little atomic bonds may be subjected to annealing even in a 450° C./4–5% hydrogen atmosphere so as to sufficiently passivate the interface charges. However, in cases of the high-k gate dielectric, there are many bonds which cannot be passivated in a 450° C./4–5% hydrogen atmosphere under 1 atm.

Figure 3:
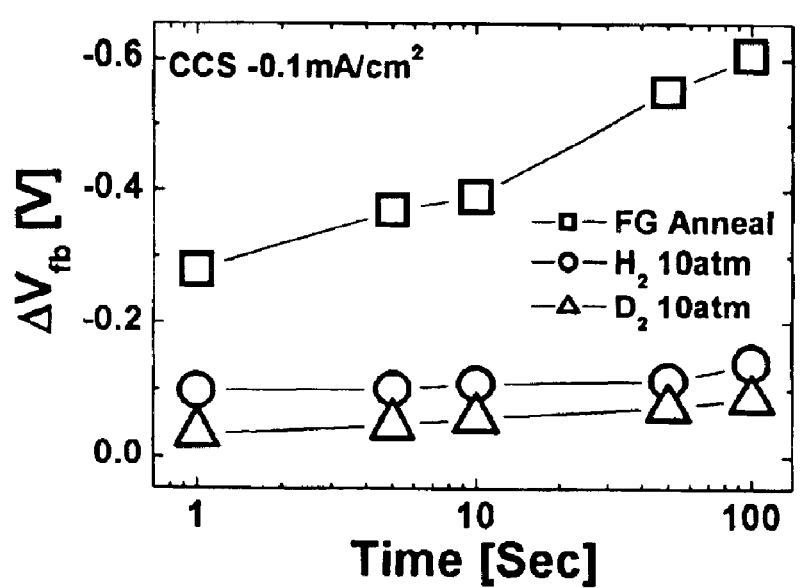
FIG. 3 is a graph showing charge trapping properties of three types of samples, one type of which is conventionally annealed using a forming gas, the other two types of which are annealed under high-pressure hydrogen and high-pressure deuterium, respectively, according to the present invention.

Turning now to FIG. 3, charge trapping properties are depicted as flatband voltage (Vfb) variation of a sample annealed conventionally using a forming gas, and samples each of which is annealed in a high-pressure hydrogen atmosphere and a high-pressure deuterium atmosphere, respectively, according to the present invention.

As seen in FIG. 3, the high-pressure hydrogen annealing results in lower charge trapping properties under the same electrical stress, compared to the conventional annealing by the forming gas. Moreover, the high-pressure deuterium annealed sample is much lower in the trapping properties than those of the high-pressure hydrogen annealed sample, according to the present invention. This is based on the heavy mass effects of deuterium.

The electrical stress functions to feed charges with high energy. Because conventional dielectrics have many dangling bonds, they have drastically increased charge trapping properties. Whereas, the high-pressure hydrogen annealed sample of the present invention possesses few dangling bonds, hence reducing the trapping properties. In addition, the deuterium atom has a higher atomic mass than the hydrogen atom, and acts to relatively decrease the generation of interface charges even though the same stress is applied.

Figure 4:
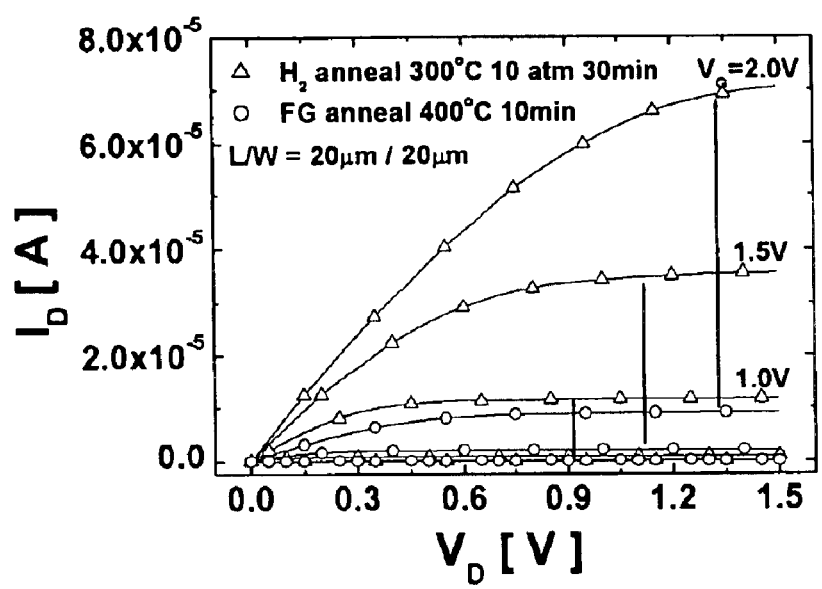
FIG. 4 is a graph showing current-voltage (I-V) properties of two types of MOSFET devices, one type of which is conventionally annealed using a forming gas, the other type of which is annealed under high-pressure hydrogen, according to the present invention.

FIG. 4 is a graph showing I-V properties of MOSFET devices using HfO$_2$ as a gate dielectric, which are conventionally annealed using a forming gas and annealed in a high-pressure hydrogen atmosphere according to the present invention, respectively. A driving current of the MOSFET device, which is high-pressure hydrogen annealed according to the present invention, is considerably higher than that of the MOSFET device annealed conventionally. Therefore, when the method of the present invention is applied for an integrated circuit process, a circuit speed is expected to be significantly fast.

A better understanding of the present invention may be obtained through the following example which is set forth to illustrate, but is not to be construed as the limit of the present invention.

EXAMPLE 1

A hafnium oxide (HfO$_2$) gate dielectric was formed by means of an atomic layer deposition (ALD), and was then subjected up to metallization, to manufacture a MOSFET device. Subsequently, the manufactured device sample was placed into a sealed container, and annealed at 400° C. under 50 atm for 30 min in a 100% hydrogen or deuterium atmosphere. The thus annealed sample was compared to one subjected to conventional annealing process (at 400° C. under 1 atm for 30 min in a 4% hydrogen atmosphere). The results are as follows.

(1) The hydrogen concentration contained in the gate dielectric was confirmed to be increased by about 10–100 times by means of SIMS.

(2) The interface state density and fixed charge density of the device sample annealed according to the present invention were about $5 \times 10^{10}$/cm$^2$-eV similar to those of silica devices, which corresponded to a value reduced by about $\frac{1}{20}$ or less, compared to about $10^{12}$/cm$^2$-eV of the device sample annealed conventionally.

(3) The charge mobility of the MOSFET device was 300–400 cm$^2$/V$_s$, similar to that of the silica devices.

(4) The charge trapping properties under electrical stress were greatly lowered, and also, service life of the device was extended. In particular, the device made of deuterium rather than hydrogen had been improved in terms of reliability.

As described above, the present invention provides a method of manufacturing a high-k gate dielectric by use of an annealing process in a high-pressure hydrogen atmosphere. According to the method of the present invention, semiconductor devices can be maximized in passivation effects of interface charges and fixed charges even at relatively low temperatures.

Further, the interface/fixed charges of the high-k gate dielectric can be effectively passivated, whereby MOSFET devices have remarkably increased charge mobility and driving current, and integrated circuit speed thereof becomes very fast.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a high-k gate dielectric, comprising annealing a semiconductor device having a high-k gate dielectric in a forming gas atmosphere, wherein the annealing of the semiconductor device is performed at 250–450° C. under 3–100 atm in a 100% hydrogen or 100% deuterium atmosphere.

* * * * *